United States Patent [19]
Glenning et al.

[11] Patent Number: 4,857,143
[45] Date of Patent: Aug. 15, 1989

[54] WET ETCHING OF CURED POLYIMIDE

[75] Inventors: John J. Glenning, Vestal; Caryn J. Johnson, Binghamton; Walter P. Pawlowski; Kenneth G. Sakorafos, both of Endicott, all of N.Y.

[73] Assignee: International Business Machines Corp., Armonk, N.Y.

[21] Appl. No.: 285,261

[22] Filed: Dec. 16, 1988

[51] Int. Cl.$^4$ .................. B44C 1/22; B29C 37/00; C03C 15/00; C03C 25/06
[52] U.S. Cl. .................... 156/668; 156/655; 156/659.1; 252/79.5
[58] Field of Search .............. 156/655, 659.1, 668, 156/904; 252/79.5, 156

[56] References Cited
U.S. PATENT DOCUMENTS

| | | | |
|---|---|---|---|
| 4,078,102 | 3/1978 | Bendz et al. | 252/79.5 X |
| 4,411,735 | 10/1983 | Belani | 252/79.5 X |
| 4,426,253 | 1/1984 | Kreuz et al. | 252/79.5 X |
| 4,431,478 | 2/1984 | Yamaoka et al. | 252/79.5 X |

*Primary Examiner*—William A. Powell
*Attorney, Agent, or Firm*—Pollock, Vande Sande & Priddy

[57] ABSTRACT

A fully cured or substantially fully cured polyimide is etched by contacting the imide with an aqueous solution of a metal hydroxide such as an alkali metal or alkali earth hydroxide and a metallic compound selected from metal carbonates, sulfates and phosphates. The presence of the carbonate, sulfate or phosphare reduces the undercutting of a resist pattern on the polyimide.

16 Claims, No Drawings

WET ETCHING OF CURED POLYIMIDE

DESCRIPTION

Technical Field

The present invention is concerned with etching a fully or at least substantially fully cured polyimide layer.

In particular, the present invention is concerned with a wet etching process for removing fully or at least substantially fully cured polyimide.

In particular, the present invention is especially suitable for forming vias in cured polyimide layers that separate metallic layers from each other to allow for selective metal connection between the separated metallic layers. Moreover, the present invention is useful to image polyimide which is used as a circuit carrier.

Background Art

The selective etching of polyimide films to provide openings or vias therein is important for various uses of polyimide. For instance, in the packaging of semiconductor chips, substrates are often provided with polyimide layers.

In a number of these situations, it is necessary to form vias in the polyimide layer to allow for electrical connections to be made between the different layers of metallurgy. In order that the interconnection be as accurate as possible, it is necessary that the polyimide films be fully cured to avoid distortion of the desired polyimide pattern and prevent attack from other wet processing chemicals.

For instance, in the formation of multi-layer substrates or thin film or tape automated bonding (TAB) for mounting chips, one configuration employs an insulating substrate of ceramic material onto which is deposited a pattern of metallic conductors. Usually, the conductors are three layers of metal being a layer of chromium or nickel, followed by a layer of copper, followed by an overlayer of chromium or nickel. On top of the metallized ceramic substrate is placed a film or layer of polyimide; on top of the polyimide a second layer of patterned conductors is provided. The conductors are generally three layers of metal being chromium or nickel, followed by copper, followed by chromium or nickel. It is necessary to electrically contact some of the conductors in the upper or second layer of metallization to some of the conductors on the lower or first layer of metallization. In order to do so, the polyimide must be selectively etched to form the desired vias therein to allow for metal connection between the upper and lower levels of metallization.

One technique for wet etching fully or substantially fully cured polyimide is using either hydrazine hydrate or ethylene diamine. Both are extremely dangerous chemicals and are avoided by industry whenever possible. Ethylene diamine is highly carcinogenic and hydrazine hydrate is highly unstable and extremely explosive. If used, both involve the use of tools which are extremely expensive because of safety concerns.

Processes have been developed in which cured polyimide film is etched using strong caustic solutions such as 8 to 15 molar hot potassium hydroxide, thus avoiding some of the problems involved in using hydrazine hydrate or ethylene diamine as etching agents. However, typically the etching is isotropic which is undesirable for etching vias. In addition, the etch profile is rough and pin holes present a problem when metal is used as an etch barrier. Accordingly, methods to etch polyimides and especially fully or at least substantially fully cured polyimides have not been entirely satisfactory and could stand significant improvement.

SUMMARY OF THE INVENTION

In accordance with the present invention, a process is provided for etching a fully cured or substantially fully cured polyimide layer which comprises contacting said polyimide layer with an aqueous solution at least about 3 molar of a metal hydroxide and at least about 0.5 molar of a member selected from the group consisting of metal carbonates, metal sulfates and metal phosphates.

Etching polyimides in accordance with this invention results in etched surfaces having a smooth and even etch profile. Furthermore, the etching is anisotropic, which significantly reduces undercutting of the resist during the etching process. This reduction in undercutting is especially significant with permanent resist materials such as those disclosed in U.S. Pat. No 4,292,230, disclosure of which is incorprated herein by reference.

In addition, the effect of pinholes in metal layer is significantly decreased in those processes wherein a metal layer is used as an etch barrier.

A polyimide film is susceptible to a base catalyzed hydrolysis resulting in the formation of the corresponding salt of polyamic acid which is soluble in the etchant. Polyimide etching is a diffusion-controlled process, the hydroxide, which is very mobile, rapidly penetrating the surface of the film. While the functions of the carbonate, sulfate or phosphate are not known, it is believed that the presence of these anions significantly decreases the mobility of the hydroxide, thus reducing the lateral attack of the hydroxide on the polyimide film.

BEST AND VARIOUS MODES FOR CARRYING OUT THE INVENTION

The etching process of the present invention is concerned with the etching of fully or at least substantially fully cured polyimide. In particular, the fully or at least substantially fully cured polyimides etched pursuant to the present invention are those having a significant amount of ring closure from chemical and/or from subsequent thermal treatment. In the preferred aspects of the present invention, the cured polyimide has about 100% imidization content.

The polyimides treated pursuant to the present invention preferably are those which have been chemically cured.

The polyimides that can be etched in accordance with the present invention include unmodified polyimides, as well as modified polyimides such as polyester imides, polyamide-imide-esters, polyamide-imides, polysiloxane-imides, as well as other mixed polyimides.

Such is well-known in the prior art, and need not be described in any great detail.

Generally, the polyimides include the following recurring unit:

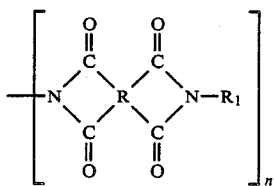

where n is an integer representing the number of repeating units to provide a molecular weight usually about 10,000 to about 100,000. R is at least one tetravalent organic radical selected from the group consisting of:

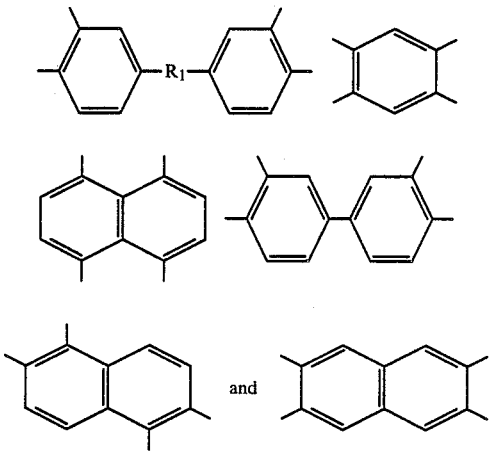

and $R_2$ being selected from the group consisting of divalent aliphatic hydrocarbon radicals having from 1 to 4 carbon atoms and carbonyl, oxy, sulfo, hexafluoroisopropylidene and sulfonyl radicals and in which $R_1$ is at least one divalent radical selected from the group consisting of:

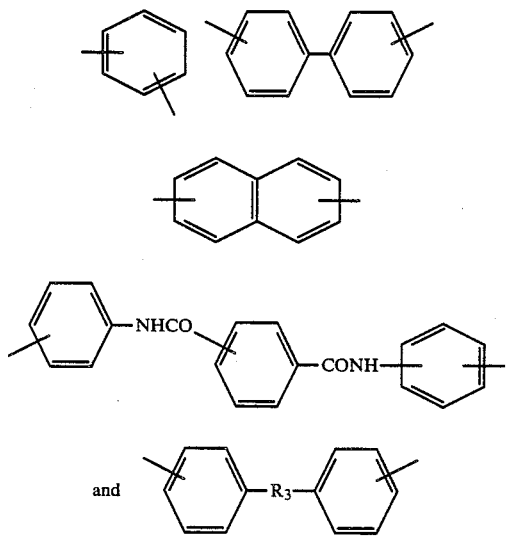

and in which $R_3$ is a divalent organic radical selected from the group consisting of $R_2$, silico, and amino radicals. Polymers containing two or more of the R and/or $R_1$ radicals, especially multiple series of $R_1$ containing amido radicals, can be used.

Commercially available polyimide precursors (polyamic acid) and particularly various polyimide precursors from DuPont are available under the trade designation Pyralin. This polyimide precursor comes in many grades, including those available Pyralin polyiimide precursors from DuPont under the further trade designations PI-2555, PI-2545, PI-2560, PI-5878, PIH-61454, and PI-2540. A number of these are Pyromelletic Dianhydride-Oxydianaline (PMDA-ODA) polyimide precursors.

Commercially available chemically cured polyimides are various polyimide from DuPont and available under the trade designation Kapton, including H-Kapton, V-Kapton, HN-Kapton, and VN-Kapton, which are all chemically cured polyimides. The chemically cured polyimides are generally cured with acetic anhydride and pyridine.

It is understood that the present invention is concerned with etching fully or at least substantially fully cured polyimides as distinguished from partially cured polyimides that include only about 20% to about 70% imidization.

The process of the present invention is carried out by contacting preselected areas of the polyimide with an aqueous solution containing a mixture of a metal hydroxide and a member selected from the group consisting of metal carbonates, sulfates and phosphates. The preferred metals of these compounds are the alkaline earth and alkali metals, and the ones most preferred are the sodium and potassium compounds.

The concentration of the hydroxide in the etching solution may range from about 3 molar to saturation, preferably is about 4 to about 8 molar, and most preferably is about 6 to 7 molar.

The concentration of the carbonate, sulfate or phosphate may range from about 0.5 to about 4.0 molar.

The time for etching depends upon the thickness of the film to be etched and typically is from about 5 to about 8 minutes, and preferably is about 6 to 7 minutes for a 2 mil film using as an etchant a solution containing potassium hydroxide and potassium carbonate etched from two sides.

The etching solution is generally held at a temperature from about 75° C. to the temperature at which the solution boils, and preferably is at a temperature from 75° C. to 100° C.

The method of etching cured polyimides in accordance with the invention is broadly applicable to processes in which patterns are formed on a polyimide layer and may be used in conjunction with different sequences of steps including various known pre-etching or post-etching procedures. For example, the present process of etching may be preceded by a step of presoaking the polyimide in hot water and/or succeeded by a step of contacting the etched polyimide with an acid for neutralizing residual caustics. An etching process including additional steps which may be used with the present invention is described in detail in co-assigned patent application Ser. No. 218,384 filed July 13, 1988, for "Wet Etching of Thermally or Chemically Cured Polyimide". Details of these and other modifications to a wet etching process which may be used in conjunction with the present process as described in Ser. No. 218,384 are hereby incorporated by reference.

As described in Ser. No. 218,384, polyimide which has been etched by contact with a caustic solution is then contacted with a strong inorganic acid such as hydrochloric acid or sulfuric acid or an organic acid such as acetic acid, preferably at a concentration of about 2 to about 8 molar for a period of about 1 to about 5 minutes at about room temperature or above. In between the base and acid baths, a water rinse may be incorporated to minimize bath neutralization due to transfer of chemicals from one bath to another.

When etching chemically cured polyimides, partially etched polyimide often remains, forming what has been referred to as "spider webs". It has been found that such partially etched polyimide can be removed without forming new partially etched polyimide by the contact of an acid such as hydrochloric acid or sulfuric acid. When chromium is also present, sulfuric acid is employed since hydrochloric acid will attack the chromium. This step may be carried out at a temperature from about 70° C. to the temperature at which the acid composition boils, preferably about 80° C., and takes from about 3 to about 10 minutes.

In addition, if desired, the polyimide, after the etching, can then be rinsed with hot water such as water at about 95° C. for about 1 to about 5 minutes and preferably for about 2 minutes. This is then followed by a dilute acid bath to neutralize any residual base on the surfaces of the structure. This is then followed by another water rinse.

According to another modification of the overall etching process, chemically cured polyimide is presoaked in hot water, followed by the etching in accordance with this invention. The temperature of the water for the presoak is usually about 55°-95° C. and preferably about 70°-95° C., and usually for at least about 30 seconds and preferably about 1½ to about 2½ minutes, the time being dependent, to some extent, upon the film thickness. For instance, a 2 minute soak is quite adequate for a 2 mil thick film.

The hot water quickly heats up and swells the chemically cured polyimide. The swelling permits a quicker penetration of the etching solution with the film, while the increased temperature raises the reaction rate. This process aspect of the present invention increases the etch rate of the chemically cured polyimide by about a factor of 2.

In various structures that employ cured polyimides, copper lines are present thereon which, in turn, are plated with gold for subsequent soldering procedures. However, during the etch of the polyimide with hot caustic, oxidation of the copper tends to occur. If the oxidation is excessive, it becomes difficult, if not impossible, to remove all of the oxide. This, in turn, prevents the plating of the gold. Copper oxidation may be eliminated by procedures which are described below. In addition, as will be discussed, improved adhesion of the photoresist will be achieved. These procedures also allow for an inspection of the quality of the lamination of the photoresist.

In a typical arrangement involving this feature, a polyimide substrate, such as about 2 mils thick, has on each major surface thereof a seed layer of chromium, typically about 200 A, followed by a seed layer of copper, typically about 800 A.

A photoresist is then applied, exposed and developed to provide a desired pattern for the subsequently to be plated, relatively thick copper.

Typical positive photoresists are based on phenol formaldehyde novolak polymers. A particular example of such is Shipley AZ-1350, which is an m-cresol formaldehyde novolak polymer composition. This composition is a positive resist and includes therein diazoketone such as 2-diazo-1-naphthol-5-sulphonic acid ester. In such a composition, the orthodiazoketone, during the photochemical reaction, is converted to a carboxylic acid. This, in turn, converts a neutral-organic soluble molecule (the phenolic polymer) to one that is readily soluble in weakly alkali aqueous developer solvents. The composition usually contains about 15% or so, by weight, of the diazoketone compound. Another commercially available negative photoresist employed is Dynachem UF.

After development of the photoresist, copper is plated by well-known techniques in those areas on both sides of the substrate where the photoresist has been removed. The thickness of the copper being typically about 1.1 mils to about 1.4 mils. After plating the copper in the desired pattern, the remaining positive photoresist is removed.

Next, another photoresist is provided, preferably by lamination, and typically about 1-2 mils thick. This photoresist is used to define the image in the seed metal for subsequent Kapton etching.

Since the photoresist does not conform identically with the patterned copper, there will exist regions that are free of material between the photoresist and copper lines. However, since seed metals are still present at this stage on the polyimide surface adjacent the copper lines, such will act as an etch barrier to prevent etch back of the lines in subsequent etching steps of the polyimide. It is preferred that this photoresist layer be a negative resist.

Examples of some photoresists employed according to the present invention include negative or photohardenable polymerizable compositions of the type suggested in U.S. Pat. Nos. 3,469,982, 3,526,504, 3,867,153 and 3,448,098, and published European Patent application No. 0049504, disclosures of which are incorporated herein by reference. Polymers from methylmethacrylate and from glycidyl acrylate and/or from a polyacrylate such as trimethylol propane triacrylate and pentaerythritol triacrylate are commercially available from E. I. DuPont de Nemours and Company under the trade designation "Riston".

Examples of some negative photoresists employed according to the present invention are from polymethylmethacrylates such as those commercially available from E. I. DuPont de Nemours and Company under the trade designation "Riston T-168".

"Riston T-168" is a negative photoresist material from polymethylmethacrylate and cross-linkable monomeric units, such as from trimethylol propane triacrylate. A detailed discussion of preparing a negative resist from polymethylmethacrylate, trimethylol propane triacrylate, and trimethylene glycol diacetate can be found in Example 1 of U.S. Pat. No. 3,867,153. Examples of aqueous developable negative photoresists are described in published European Patent Application No. 0049504, such as Example 23 thereof, disclosure of which is incorporated herein by reference. A typical resist described therein is from a copolymer of methylmethacrylate, ethyl acrylate, and acrylic acid, and a copolymer of styrene and maleic anhydride isobutyl ester.

By employing this particular sequence of steps, the resist will be provided on only copper, as contrasted to the prior art whereby the resist is laminated only after the seed metals have been removed and, therefore, are laminated to mainly polyimide with some copper lines present. The adhesion of the resist to copper is significantly greater, for instance, about ten times greater, than it is to the polyimide.

Problems of resist delamination from the polyimide have been observed, but not from the copper. Furthermore, in the case of the prior process, if the resist delaminates from the polyimide, the etch barrier is broken and the etchant will attack all of the polyimide. This cannot occur in the present invention because the seed metal is still present.

Furthermore, if a problem exists at the laminator where the laminator does not properly laminate the resist, it will be clearly visible prior to the polyimide etch. On the other hand, a gap or poor lamination between the resist and polyimide is not readily seen.

The resist is then exposed to the desired pattern, imaged, and then developed by removal of the unexposed seed material by dissolution in an appropriate liquid in the case of a negative resist. When this resist is Riston T-168, it can be developed employing methylchloroform or 1, 1, 1-tricholoroethane.

A critical distinction of this feature is employing a flash etching step at this point in the process.

The flash etch is to remove only the seed metal from those locations where polyimide is to be subsequently etched and still leave seed metal adjacent to copper lines to avoid the etch back. The flash etch for removing copper can be a ferric chloride, cupric chloride, or potassium persulfate aqueous solution, typically about 0.1 to about 5.0 molar, such as about 0.1 molar solution of ferric chloride for about 15 seconds to about 180 seconds, typical of which is about 45 seconds at temperatures of about ambient to about 65° C., typical of which is 30° C.

The flash etch for the chromium layer can employ a solution of about 10 grams/liter to about 200 grams/liter, typical of which is 60 grams/liter of potassium permanganate, and about 0.1 molar to about 5.0 molar, typical of which is about 0.5 molar NaOH. This etch is carried out at about ambient to about 70° C., typical of which is about 39° C. for about 15 seconds to about 240 seconds, typically about 90 seconds (dependent on metal thickness).

Next, the exposed polyimide is etched such as using a solution at least about 3 molar in potassium hydroxide and at least about 0.5 molar in potassium carbonate.

The resist is then removed by dissolution in an appropriate solvent. For example, the exposed Riston T-168 can be removed with methylene chloride.

After this, the remaining seed copper and chromium is removed by a second flash etch of the types discussed above.

The structure is now ready for the gold plating.

In order to facilitate a further understanding of the present invention, the following non-limiting examples are presented:

EXAMPLE 1

A 5 mil thick resist-patterned, fully curved film on H-Kapton is immersed in an aqueous caustic etching solution formed by adding 486 grams of KOH to 705 ml. H₂O. The film is immersed in the etchant at 95° C. for 5 minutes and then rinsed for 2 minutes in water at 95° C. The undercutting or etch back of the resist is measured and is 9.7 mils.

EXAMPLES 2-15

The procedure of Example 1 is followed using as an etching solution of the solution of Example 1 to which has been added various amounts of $K_2CO_3$. The results of Examples 1-15 are shown in the following table:

| Example No. | $K_2CO_3$ (grams) | Etch back (mils) |
|---|---|---|
| 1 | 0 | 9.7 |
| 2 | 60 | 6.8 |
| 3 | 80 | 6.0 |
| 4 | 100 | 7.5 |
| 5 | 120 | 5.0 |
| 6 | 140 | 5.4 |
| 7 | 170 | 5.6 |
| 8 | 200 | 4.7 |
| 9 | 230 | 4.6 |
| 10 | 260 | 4.2 |
| 11 | 290 | 2.5 |
| 12 | 330 | 1.7 |
| 13 | 370 | 1.0 |
| 14 | 410 | 0.75 |
| 15 | 450 | 0.65 |

What is claimed is:

1. A process for etching a fully cured or substantially fully cured polyimide layer which comprises contacting said polyimide layer with an aqueous solution at least about 3 molar of a metal hydroxide and at least about 0.5 molar of a metallic compound including an anion selected from the group consisting of carbonates, sulfates and phosphates.

2. The process of claim 1 wherein the concentration of said metal hydroxide is about 4 to about 8 molar.

3. The process of claim 1 wherein the concentration of said anion is about 1.5 to about 2.5 molar.

4. The process of claim 1 wherein the metal hydroxide is an alkaline earth or alkali metal hydroxide.

5. The process of claim 1 wherein the metal associated with said anion is an alkaline earth or alkali metal.

6. The process of claim 1 wherein said polyimide layer is a chemically cured polyimide.

7. A process for etching a fully cured or substantially fully cured polyimide layer which comprises contacting said polyimide layer with an aqueous solution at least about 3 molar in an alkali metal hydroxide and at least about 0.5 molar in an alkali metal carbonate.

8. The process of claim 7 wherein the concentration of alkali metal hydroxide is about 4 to about 8 molar.

9. The process of claim 7 wherein the concentration of alkali metal hydroxide is about 6 to about 7 molar.

10. The process of claim 7 wherein the concentration of the alkali metal carbonate is about 1.5 to about 2.5 molar.

11. The process of claim 7 wherein the concentration of alkali metal hydroxide is about 4 to about 8 molar and the concentration of alkali metal carbonate is about 1.5 to about 2.5 molar.

12. The process of claim 7 wherein the concentration of alkali metal hydroxide is about 6 to 7 molar and the concentration of alkali metal carbonate is about 1.5 to about 2.5 molar.

13. The process of claim 7 wherein said alkali metal is potassium.

14. The process of claim 7 wherein said alkali metal is sodium.

15. The process of claim 7 wherein the solution of alkali metal hydroxide and alkali metal carbonate is contacted with said polyimide layer at a temperature of about 75° to about 100° C.

16. The process of claim 7 wherein said polyimide is a chemically cured polyimide.

* * * * *

UNITED STATES PATENT AND TRADEMARK OFFICE
CERTIFICATE OF CORRECTION

PATENT NO. : 4,857,143
DATED : August 15, 1989
INVENTOR(S) : Glenning et al

It is certified that error appears in the above-identified patent and that said Letters Patent is hereby corrected as shown below:

In column 2, line 26, before "metal" insert --a surface--.

In column 3, lines 15-20, change "$R_1$" to --$R_2$--.

In column 7, line 58, change "curved" to --cured--.

Signed and Sealed this

First Day of January, 1991

Attest:

HARRY F. MANBECK, JR.

*Attesting Officer*  *Commissioner of Patents and Trademarks*